(12) United States Patent
Welty (10) Patent No.: US 10,374,420 B2
(45) Date of Patent: Aug. 6, 2019

(54) ESD POSITIVE AND NEGATIVE DETECTION AND CAPTURE, AND LOGGING CIRCUITRY

(71) Applicant: TEXAS INSTRUMENTS INCORPORATED, Dallas, TX (US)

(72) Inventor: Mark B. Welty, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 332 days.

(21) Appl. No.: 15/428,720

(22) Filed: Feb. 9, 2017

(65) Prior Publication Data

US 2017/0222431 A1 Aug. 3, 2017

Related U.S. Application Data

(62) Division of application No. 14/670,003, filed on Mar. 26, 2015, now Pat. No. 9,608,429.

(60) Provisional application No. 61/971,342, filed on Mar. 27, 2014.

(51) Int. Cl.
| | |
|---|---|
| *H02H 9/04* | (2006.01) |
| *H02H 1/00* | (2006.01) |
| *G01R 31/12* | (2006.01) |
| *H01L 27/02* | (2006.01) |

(52) U.S. Cl.
CPC ......... *H02H 9/046* (2013.01); *G01R 31/1272* (2013.01); *H02H 1/0007* (2013.01); *H02H 1/0092* (2013.01); *H02H 9/045* (2013.01); *H01L 27/0251* (2013.01); *H02H 9/04* (2013.01); *H02H 9/041* (2013.01)

(58) Field of Classification Search
USPC .......................................... 361/56, 91.1, 111
See application file for complete search history.

(56) References Cited

U.S. PATENT DOCUMENTS

| | | |
|---|---|---|
| 5,255,146 A | 10/1993 | Miller |
| 7,570,468 B2 | 8/2009 | Bernard et al. |
| 8,861,158 B2 | 10/2014 | Zupcau |
| 2009/0052100 A1 | 2/2009 | Robb et al. |
| 2010/0271742 A1 | 10/2010 | Shannon et al. |
| 2014/0071092 A1 | 3/2014 | Shih et al. |
| 2014/0111465 A1 | 4/2014 | Shih et al. |
| 2014/0191778 A1 | 7/2014 | DeForge et al. |
| 2014/0268444 A1 | 9/2014 | Bertin |
| 2015/0262994 A1* | 9/2015 | Hsu ..................... H01L 27/0248 361/56 |

\* cited by examiner

*Primary Examiner* — Danny Nguyen
(74) *Attorney, Agent, or Firm* — Lawrence J. Bassuk; Charles A. Brill; Frank D. Cimino (57) ABSTRACT

An electrostatic discharge (ESD) logging system includes ESD detection circuitry having at least one input electrically connected coupled to a node of an ESD protection circuit. The ESD detection circuitry provides a detector signal in response to detecting an ESD event at the node of the ESD protection circuit. Capture circuitry is electrically connected to an output of the ESD event detector. The capture circuitry asserts a capture signal to indicate the occurrence of the ESD event in response to the detector signal. A logic circuit provides a logic output in response to the capture signal.

19 Claims, 4 Drawing Sheets

ESD POSITIVE AND NEGATIVE DETECTION AND CAPTURE, AND LOGGING CIRCUITRY

CROSS REFERENCE TO RELATED APPLICATION

This application is a divisional of prior U.S. application Ser. No. 14/670,003, filed Mar. 26, 2015, now U.S. Pat. No. 9,608,429, issued Mar. 28, 2017;

And claims the benefit of U.S. Provisional Patent Application No. 61/971,342, filed Mar. 27, 2014, and entitled CIRCUIT AND METHOD FOR LOGGING ESD EVENTS IN ELECTRONIC DEVICES, which is incorporated herein by reference in its entirety.

TECHNICAL FIELD

This disclosure relates to electronic circuits, and more specifically to logging electrostatic discharge events.

BACKGROUND

Electrostatic discharge (ESD) is the sudden flow of electricity between two electrically charged objects, such as may be caused by physical contact, an electrical short, or dielectric breakdown. The ESD occurs when differently-charged objects are brought close together or when the dielectric between them breaks down, often creating a visible spark. ESD can create spectacular electric sparks (e.g., lightning being a large-scale ESD event), but also less dramatic forms that may be neither seen nor heard, yet still be large enough to cause damage to sensitive electronic devices. Accordingly, ESD protection has become very important in today's world, not only in the industrial space, but also in the consumer space as devices become portable, haptic and widely used.

SUMMARY

This disclosure relates to electronic circuits, and more specifically to logging electrostatic discharge events.

As one example, an electrostatic discharge (ESD) logging system includes ESD detection circuitry having at least one input electrically connected coupled to a node of an ESD protection circuit. The ESD detection circuitry provides a detector signal in response to detecting an ESD event at the node of the ESD protection circuit. Capture circuitry is electrically connected to an output of the ESD event detector. The capture circuitry asserts a capture signal to indicate the occurrence of the ESD event in response to the detector signal. A logic circuit provides a logic output in response to the capture signal.

As another example, an electrostatic discharge (ESD) system includes ESD protection circuitry to provide ESD protection in response to an ESD signal that occurs at a given node of the ESD protection circuitry. A positive strike ESD detector provides a first detector signal in response to detecting a positive strike ESD event for a given node of the ESD protection circuitry. A negative strike ESD detector provides a second detector signal in response to detecting a negative strike ESD event for the given node of the ESD protection circuitry. Capture circuitry provides a first capture signal in response to the first detector signal and that provides a second capture signal in response to the second detector signal. A logic circuit provides a logic output in response to each of the first capture signal or the second capture signal.

As yet another example, a method includes clamping an electrostatic discharge (ESD) event that occurs at given node. The method also includes detecting the ESD event at the given node and providing a detection signal indicative of the detected ESD event. The method also includes delaying the detection signal and capturing the ESD event based on the delayed detection signal. The method also includes generating a logic output signal to log the detected ESD event.

DETAILED DESCRIPTION

This disclosure relates to electronic circuits and more particularly to logging electrostatic discharge (ESD) events, such as may occur in electrical circuits and system including such circuits. The approach employs strike detector circuitry that can be coupled to one or more ESD protection circuits. The strike detector circuitry can include positive and/or negative strike detectors for detecting different types of respective ESD events at one or more nodes of the ESD protection circuits. Capture circuitry extends the detection signal from the detection circuitry to enable output logic to provide a corresponding output logic signal indicative of the detected ESD event, but delayed with respect to the event to mitigate noise and maintain signal integrity of such logic apart from the ESD event. The output signal further can be utilized by associated circuitry (e.g., the microprocessor, a detection function implemented in the microprocessor or the like) to store an indication of the ESD event in response to the output logic signal.

As a result of implementing systems and methods according to this disclosure, the occurrence of the ESD events can thus be identified and logged in associated memory. The logged events can be accessed from memory such as to understand information about an ESD event, such as for repair or warranty considerations by manufacturers or other service providers.

Figures 1, 5:
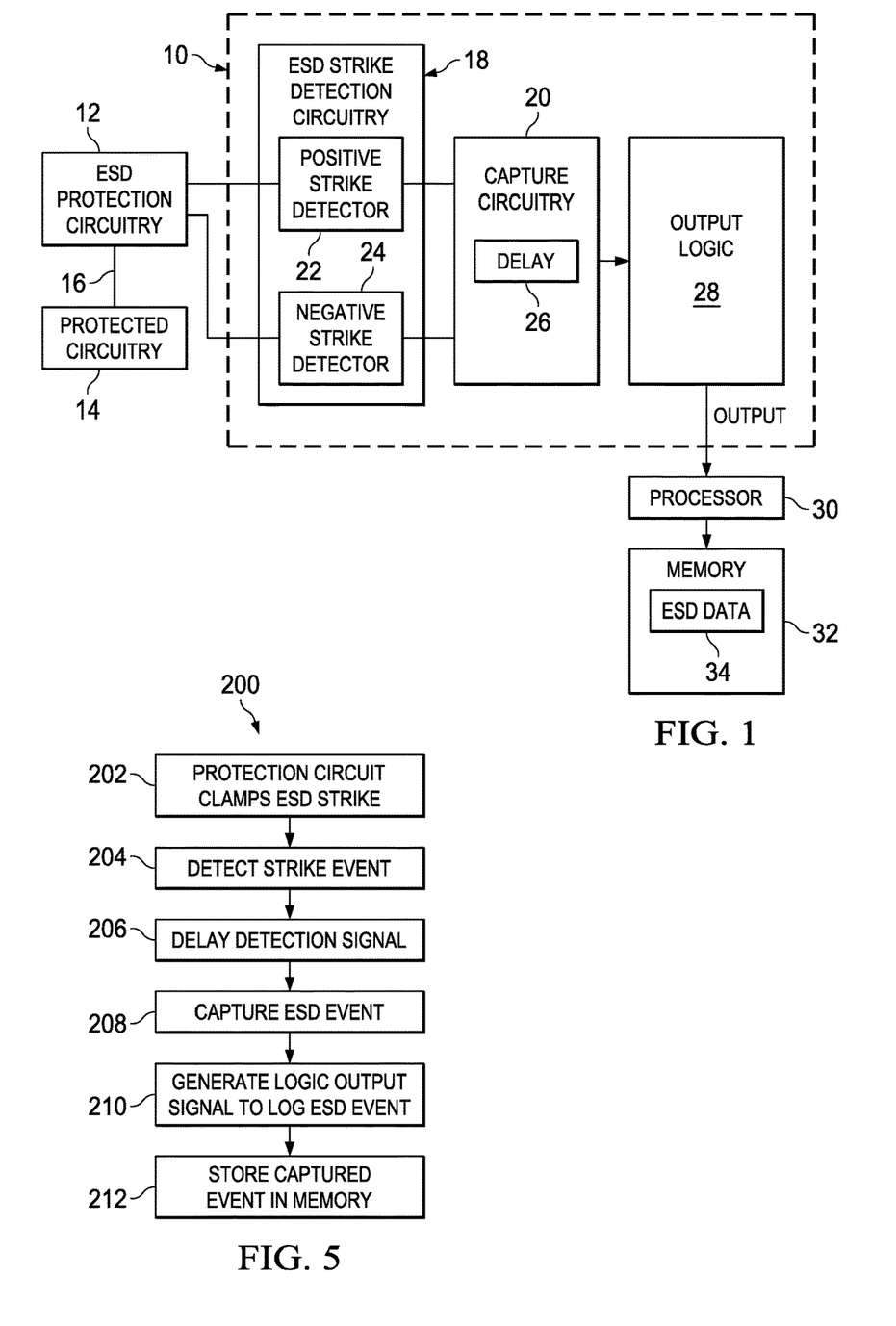
FIG. 1 depicts an example of a system for logging an ESD event.
FIG. 5 is a flow diagram depicting an example of a method for logging an ESD event.

FIG. 1 depicts an example of a system 10 for logging ESD events. The ESD logging system 10 can be electrically connected to ESD protection circuitry 12. The ESD protection circuitry 12 is configured to protect associated circuitry, demonstrated as protected circuitry 14. For example the ESD protection circuitry 12 can be connected to one or more nodes of the protected circuitry via one or more electrical connections 16 between the protected circuitry 14 and the ESD protection circuit 12. In some examples, the ESD protection circuitry 12 can be integrated into the protected circuitry 14, such that the connections 16 can include electrical traces disposed on or within a substrate of a corresponding integrated circuit. In other examples, such as for providing system level ESD protection, the ESD protection circuitry 12 and the ESD logging system 10 can be implemented in an integrated circuit (e.g., on a common substrate). The integrated circuit that includes 10 and 12 can be electrically coupled to appropriate inputs and busses of the protected circuitry 14 via the connections 16, such as can include circuit board traces, wires or the like. The ESD protection circuitry 12 thus can include one or more circuits (e.g., clamps) to provide appropriate form of protection for any number of nodes according to the type and form of protection implemented. For example, the clamping circuitry can include an arrangement of diodes and/or other switching circuitry configured to clamp ESD events.

The ESD logging system 10 includes ESD strike detection circuitry 18 having one or more inputs coupled to respective nodes of the ESD protection circuitry 12. For example, the ESD strike detector circuitry 18 can be electrically coupled to each terminal or bus of the ESD protection circuitry 12 that is employed to provide protection to one or more ports or channels of the associated circuitry 14. The ESD strike detection circuitry 18 can be activated in response to the ESD event at each node (e.g., corresponding to a terminal or bus) of the protection circuitry 12 to which the detection circuitry is coupled. The ESD strike detection circuitry 18, for example, is activated to pull or push current relative to a voltage rail in response to the detected ESD event.

The ESD strike detection circuitry 18 further provides a detector output signal to capture circuitry 20 in response to the detected ESD event. The detector output signal, for example, includes electrical current flow (e.g., positive or negative current) to the capture circuitry 20 in response to the ESD event. In other examples, the detector output signal may be provided as voltage signaling. As demonstrated in the example of FIG. 1, the ESD strike detection circuitry 18 can include a positive strike detector 22 and a negative strike detector 24. The positive strike detector 22, for example, can include a detector circuit electrically coupled to a node (e.g., a voltage rail or bus) to which ESD clamping circuitry is electrically connected. The positive strike detector 22 thus can be configured as a circuit to activate in response to clamping circuitry of the ESD protection circuitry 12 being triggered to clamp a transient voltage at the node when such voltage exceeds a given protection threshold (e.g., at least greater than a positive rail or supply voltage, such as VDD).

The negative strike detector 24 further can be electrically connected to one or more other nodes of the ESD protection circuitry 12 and is electrically activated in response to a negative strike at such node(s). The negative strike detector 24 includes a detector circuit that is electrically coupled to each node (e.g., a voltage rail or terminal) to which ESD protection circuitry is electrically connected to provide clamping. The negative strike detector 24 thus can be activated in response to clamping circuitry of the ESD protection circuitry 12 being triggered to clamp a negative transient voltage at the node when such voltage is below a given protection threshold (e.g., less than electrical ground). The negative strike detector 24 thus can provide signaling (e.g., positive or negative current or voltage) at its output to the capture circuitry 20 in response to detecting the negative ESD event from the ESD protection circuitry 12.

The capture circuitry 20 can be configured to assert a capture output signal (e.g., a pulse) to specify that the ESD detection circuitry 18 has detected an ESD event. The capture circuitry 20, for example, includes delay circuitry 26 configured to blank the detector output provided by the ESD strike detector circuitry 18 for a duration sufficient to allow the ESD transient to subside as to reduce noise and interference from adversely affecting operation of the capture circuitry 20. The amount of time delay can be programmable. The delay 26 thus enables the capture circuitry 20 to provide a stable output signal (e.g., a pulse have a predetermined duration and amplitude) to corresponding output logic 28 to indicate the detection of a corresponding ESD event (e.g., detected by positive or negative strike detector 22, 24).

Additionally, the capture circuitry further can include circuitry that has two stable states in response to the changes in the delayed detection signal from the detection circuitry. For example, the capture circuitry can include a Schmitt trigger to latch circuit configured to maintain its output in a given state (e.g., an ESD detection state) until the delayed detection signal changes sufficiently to trigger a change in its output to another state (e.g., a non-detection state). Thus by delay circuitry 26 providing a blanking interval to extend the detection signal by a predetermined time interval, the capture circuitry can remain in the given state for a time period having a duration greater than the duration of the transient ESD event.

The output logic 28 can be configured to provide a corresponding digital output to indicate each occurrence of an ESD event that is detected (e.g., by detection circuitry 18). The digital output can be provided as an interrupt to a processor 30 to trigger a corresponding storage or implement other functions (e.g., ESD counter, diagnostic function or the like) related to the ESD output that is indicated thereby. For example, the processor 30 is configured to store the output and/or other related information derived from the output provided by logic 28 in memory 32 as ESD data 34. In response to the output logic 28 providing the interrupt, for example, the processor 30 can derive associated metadata for the ESD event that can be stored as part of the ESD data 34 in conjunction with the indication of the detected ESD event. The ESD metadata can include localization data specifying where the ESD event occurred (e.g., which terminal or node of the protected circuitry 14), an approximate time of the ESD event and/or other information related to the ESD event. The memory 32 can also implement instructions to provide a counter or other functions to track the number and type of ESD events, for example. The memory 32 can include non-volatile storage as to enable storage of the ESD data 34 in the absence of power, such as to facilitate evaluation of the ESD data 34 (e.g., as part of a repair or diagnostics on the circuitry and device implementing the system 10).

Figure 2A:
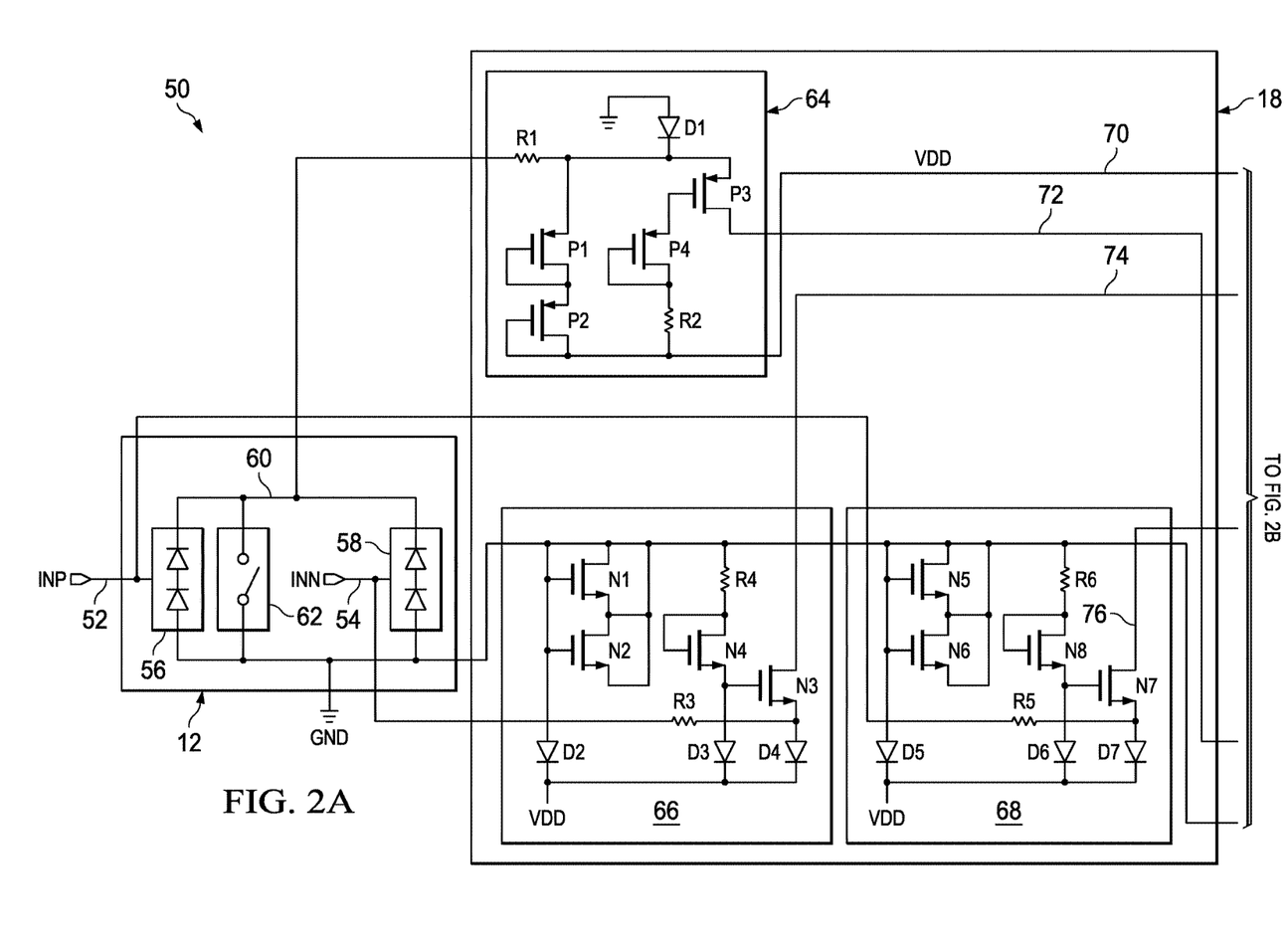
FIGS. 2A and 2B depict an example of a circuit for logging an ESD event.
Figure 2B:
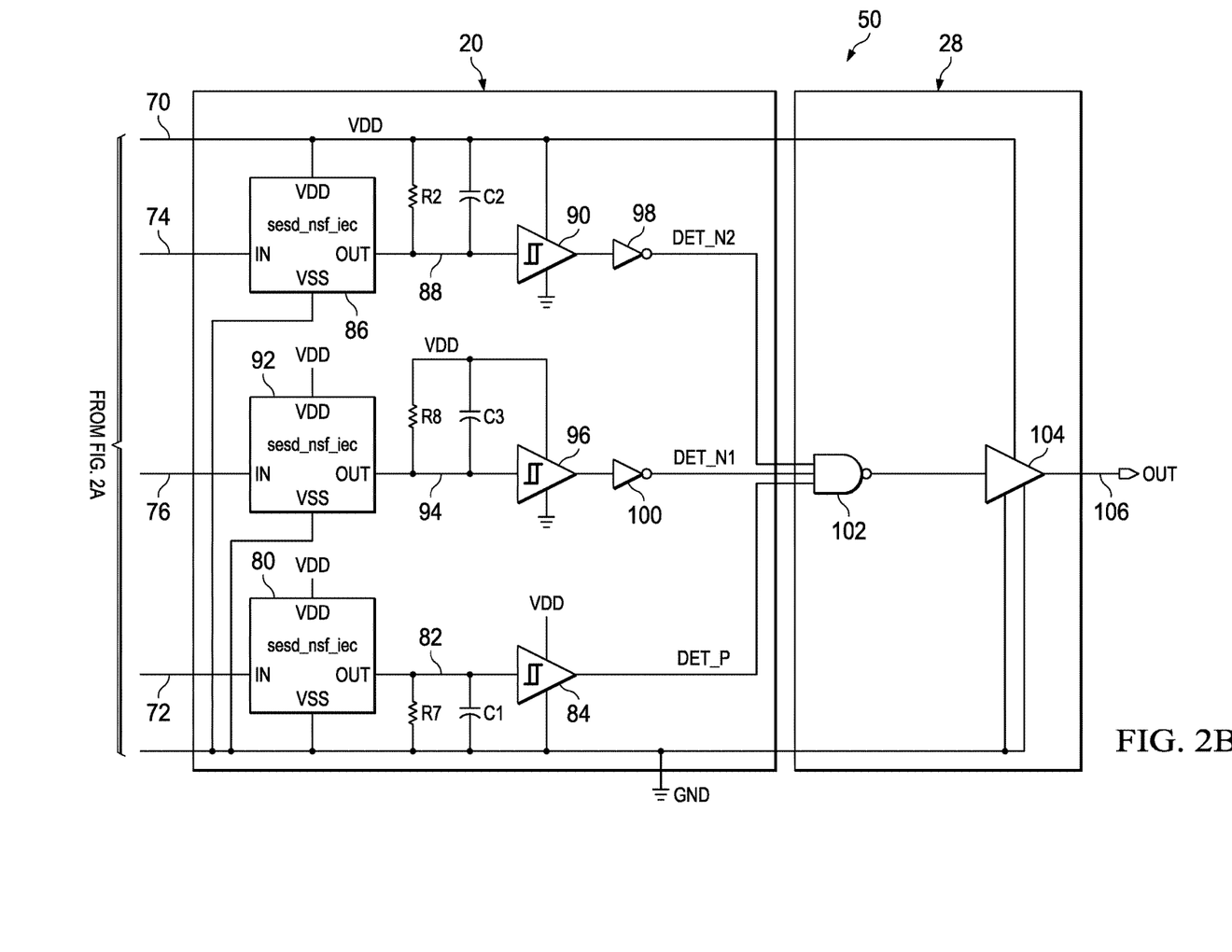

FIG. 2 depicts an example of an ESD logging system 50 in which identical reference numbers refer to components and features introduced with respect to FIG. 1. The ESD logging system 50 includes ESD strike detector circuitry 18 that is coupled to ESD protection circuitry 12. The system 50 also includes capture circuitry 20 and output logic 28.

In the example of FIG. 2, the ESD protection system 12 is configured to provide ESD protection for associated circuitry (not shown) having a differential input including a positive input terminal 52 to receive a first differential input, denoted as INP, and a negative input terminal 54 to receive another differential input, denoted as INN. Each of the terminals 52 and 54 are electrically connected to protection circuitry that includes a corresponding arrangement of diodes 56 and 58 to control current flow at the respective input terminals 52 and 54. For example, the diodes 56 and 58 each includes a serial arrangement of diodes connected between the ground terminal (GND) and an ESD clamping bus (e.g., a voltage rail of the protection circuitry) 60. An ESD clamp 62 (e.g., a FET switch device, a Zener clamp or the like) is electrically connected between the ESD bus 60 and the electrical ground of the system 50 in parallel with the diodes 56 and 58.

The terminals 52 and/or 54 can be electrically connected to connector ports or other terminals of circuitry (e.g., circuitry 14) for which ESD protection is desired. Examples of such connector ports include USB ports, audio input/output ports, Ethernet ports, video ports (e.g., HDMI, DVI, etc.) or similar ports or interfaces.

The strike detection circuitry 18 can include a plurality of strike detectors for detecting different strike events associated with different nodes of the ESD protection circuitry 12. In the example of FIG. 2, the strike detection circuitry 18 includes a plurality of strike detector circuits 64, 66, and 68. The strike detector 64 is electrically connected with the ESD bus 60 and is configured to detect positive ESD strike events at input terminals 52 and 54. That is, the strike detector 64 can detect positive ESD strike events that can occur at either of the respective input terminals 52 and 54. In other examples, separate positive strike detector circuits can be electrically connected to detect positive strike events at the respective inputs to enable further differentiation and localization of where each positive strike event occurs.

In the example of FIG. 2, the positive strike detector 64 includes an input resistor R1 that is connected between a network of transistors and the ESD bus 60. For example, the arrangement of transistors includes a pair of diode-connected transistors P1 and P2 (e.g, p-type transistors) electrically connected between the terminal resistor R1 and the positive voltage rail 70 (e.g., at VDD). Another transistor P3 is connected to the resistor R1 and a corresponding input 72 of capture circuitry 20. A transistor P4 is connected between the gate of P3 and VDD through a corresponding resistor R2. Thus, in response to a positive ESD event triggering the protection circuit 12, such as a transient voltage at either of inputs 52 or 54, the transistor P3 can be activated to pull current from the input 72 through transistor P3 to the protection circuitry 12. Thus, P3 operates in a normally off condition (e.g., an open circuit condition) and in response to the positive ESD event at one or both of the inputs 52 and 54, P3 is biased to an ON condition (e.g., closed switch) to pull current and provide a corresponding detector output signal at 72 to the capture circuitry 20.

Each of the negative strike detective circuits 66 and 68 can be similarly configured to the detector 64 but configured for detecting negative ESD strike events at each of the respective inputs 54 and 52. For example, the strike detector 66 is electrically connected to the terminal 54 to receive the negative input INN via a corresponding input resistor R3 the negative strike detector 66 further includes a series of arrangement of diode-connected N type transistors N1 and N2, which are electrically connected between GND and VDD via corresponding diode D2. Another terminal of the resistor R3 is connected to transistor N3, which is connected between the resistor R3 and a corresponding input 74 of the capture circuitry 20. The gate of N3 is connected between a diode connected transistor N4 and resistor R4 between the GND and VDD through another diode D3. The detector circuitry 66 thus operates in a normally off condition and, in response to a negative strike at the input terminal 54 being clamped, the transistor N3 is biased to an on condition via the differential voltage causing current conducting through transistor N4 as to bias N3 to its on condition and cause the current to be pulled from the input 74 via transistor N3 through the clamping of the ESD protection circuit at terminal 54.

The other negative strike detector 68 is similarly configured to negative strike detector 66 for detecting a negative strike at terminal 54. Briefly stated, the detector 68 includes resistor R5 connected to terminal 52 to receive the positive input INP. A series of arrangement of diode-connected N type transistors N5 and N6 are electrically connected between GND and VDD via corresponding diode D2. Another terminal of the resistor R5 is connected to transistor N7, which is connected between the resistor R5 and a corresponding input 76 of the capture circuitry 20. The gate of N3 is controlled in response to current flow through diode-connected transistor N4 and resistor R4 that are between the GND and VDD through another diode D3. Thus, in response to a negative strike being detected at the input 52, the transistor N7 is activated to an ON condition to pull current from a corresponding input 76 of the capture circuitry 20. While in the example of FIG. 2, the strike detectors 64, 66 and 68 have been demonstrated as circuitry configured to provide for current signaling to indicate respective detected ESD events, in other examples, such circuitry could be configured to provide voltage signaling to indicate such ESD events.

The respective inputs 72, 74 and 76 thus drive corresponding portions of the capture circuitry 20 in response to detecting a positive strike (via ESD detection circuitry 64) or a negative strike (via negative strike detectors 66 or 68, respectively). In the example of FIG. 2, input 72 is provided to ESD protection block 80 that is connected between an input 82 of Schmitt trigger 84 and 72. A resistor R7 is connected in parallel with capacitor C1 between the input node 82 and GND. R7 and C1 form an RC network having a time constant that is set to delay the transfer of the current from the input 72 to Schmitt trigger 84. The delay is sufficient to allow the ESD event to settle, such that the Schmitt trigger 84 can provide a corresponding output signal indicative of the capture ESD event after the transient nature of the ESD event has subsided. The output of Schmitt trigger 84 can be electrically connected to an input of the output logic 28.

Similar capture circuitry can further be driven by each of the other strike detectors 66 and 68. For example, the output 74 of negative strike detector 66 can be electrically connected to ESD protection block 86 (e.g., an input to capture circuitry 20). Parallel RC network of resistor R9 and capacitor C2 can be connected between the output 88 of ESD protection block 86 and voltage rail 70. The RC network is similarly configured to delay the detection signal (e.g., pull of current) in response to activation of the ESD strike detector 66 as to supply a corresponding time delayed detection signal at 88 of the Schmitt trigger 90. The Schmitt trigger 90 in turn provide a corresponding output that can be provided to an input of an inverter 98, which can invert the corresponding logic signal to another input of the output logic 28.

The output 76 of the negative strike detector 68 similarly can be provided to an ESD protection block 92 that is connected to an input 94 of Schmitt trigger 96. The input 94 further can be connected between the voltage rail VDD via RC network of resistor R8 and capacitor C3. The RC network is configured to delay the signal at 94 in response to the negative strike detected at 52 via the strike detector circuit 68. As a result, the corresponding detection signal provided at the input 94 of Schmitt trigger 96 can be extended for a duration (e.g., according to the time constant of the RC network) sufficient for the transients to subside and permit appropriate operation of the circuitry 20 without adverse effects of the negative strike. The output of the Schmitt trigger 96 can be provided via an inverter 100 to another input of the output logic 28.

In the example of FIG. 2, the output logic 28 can include logic circuit 102 to aggregate the inputs from the respective capture circuits 64, 66 and 68. Thus, the logic circuit can provide a corresponding logic output (e.g., a binary signal or a multi-bit signal) based upon the combination of signals. In the example of FIG. 2, the logic 102 is an AND-gate to a corresponding logical binary output. Other types of logic (e.g., Boolean or combinatorial logic) to provide additional information (e.g., localization information about where the strike occurred) in response to each detected ESD event. The logic 102 provides its output to a buffer 104 that can in turn be provided as a logic output at 106. The output 106 can be provided to other detection circuitry or to trigger an interrupt for a microprocessor, for example.

The indication of a strike event can thus be recorded in memory for subsequent analysis. For example, the indication of strike event at the output 106 can be employed to increment a counter, which can provide a count of a number of ESD events that might occur over a time interval. In some examples, the output logic 28 can separately provide corresponding individual outputs based on the ESD detection signals provided by each of the detectors 64, 66 and 68, such that the location of the strike events can be discerned from the corresponding logic outputs that are provided. In this way information about the location of where an ESD occurs can also be identified and stored in appropriate memory based upon the outputs provided thereby. Additionally, by separating the positive and negative strike events for each of the respective inputs an indication as to whether a strike is a positive or negative strike can also be indicated depending upon which output is asserted in response to an ESD event. Thus it is understood that the output logic 28 can be configured to provide different levels of granularity of information associated with each of the detected ESD events.

Figure 3:
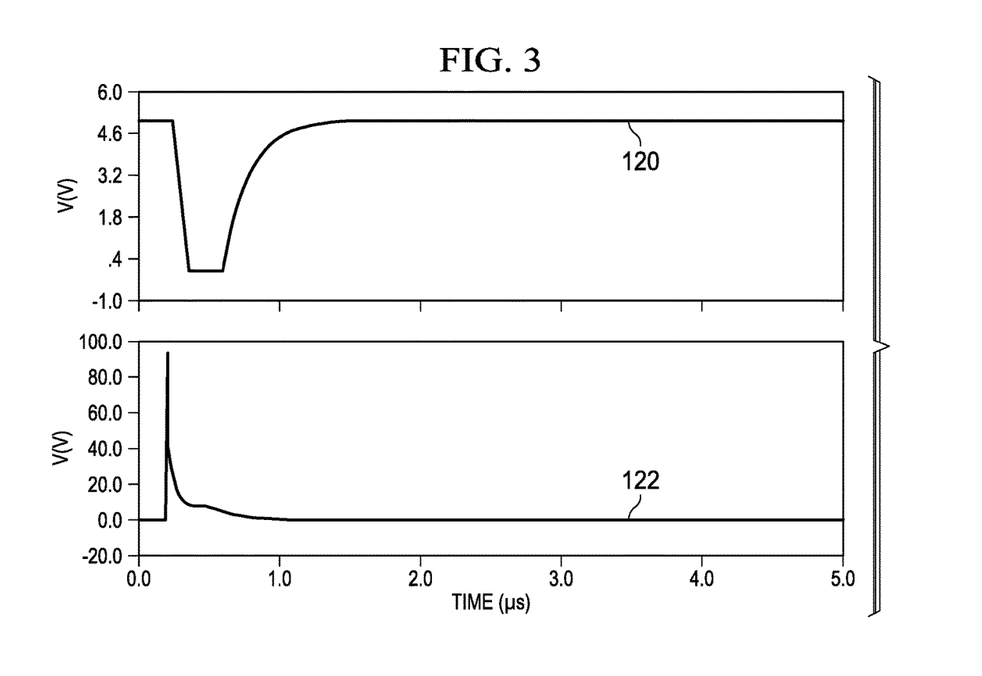
FIG. 3 depicts a graph showing examples of signals associated with logging an ESD event via the circuit of FIG. 2.
Figure 4:
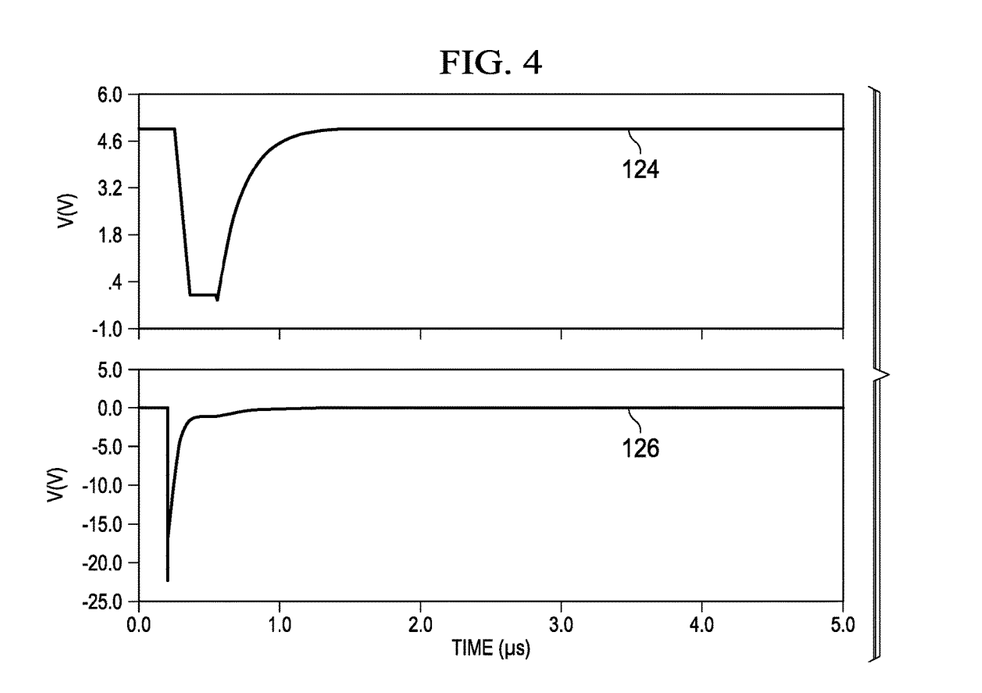
FIG. 4 depicts a graph showing examples of signals associated with logging another ESD event via the circuit of FIG. 2.

As a further example, FIGS. 3 and 4 depict examples of detected signal outputs in response to detecting ESD events using the example system 50 of FIG. 2. In the example of FIG. 3, a detector output signal 120 demonstrates the delayed output at the input 82 to Schmitt trigger 84 in response to a positive strike event at input 52 corresponding to input signal at INP. The ESD transient signal at node INP is shown at 122. In the example of FIG. 4, a detect output signal 124 corresponds to the delayed version of the detector signal at input 94 in response to a negative strike event detected at the input 52 corresponding to signal 126 (e.g., INP). In each of the FIGS. 3 and 4, the detector output signal has been extended in response to the delay of the RC networks (e.g., delay 26) in the corresponding capture circuitry 20. For instance, the delay extends each detector signal 120 or 124 to enable capture of each respective detector signal, including after the transient ESD signal 122 or 126 has subsided to relative to a predetermined amount, such as shown in FIGS. 3 and 4. It is understood that the duration of the delay imposed in each of the output signals 120 and 124 by delay circuitry can be adjusted, such as by modifying the RC time constant provided by the delay 26 capture circuitry 20. The RC time constant thus can be configured to provide blanking time to allow the transient to subside such that the corresponding circuitry can operate without the detrimental effects of transient spikes events, while still providing a corresponding detection signal for each ESD event that is being logged thereby.

In view of the foregoing structural and functional features described above, an example method will be better appreciated with reference to FIG. 5. While, for purposes of simplicity of explanation, the example method of FIG. 5 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method. The example method of FIG. 5 can be implemented as hardware, such as integrated circuits and/or discrete components.

FIG. 5 illustrates an example of a method 200 that can be implemented for logging ESD events. The method begins at 202 at which a protection circuit clamps a corresponding ESD strike. The clamping can be implemented by a variety of protection circuits such as the circuit 12 demonstrated in FIGS. 1 and 2. At 204, the ESD strike event is detected (e.g., by strike detector circuitry 18, 64, 66 or 68). For example, in response to an ESD event at a corresponding input of associated circuitry, strike detection circuitry can provide a detector signal (e.g., current flow or voltage signaling) in response to the strike event being detected.

At 206, the detection signal representing the ESD event can be extended (e.g., via delay element) for a predetermined time period. At 208, the corresponding delayed detection ESD event signal can be captured (e.g., by capture circuitry 20) to provide a corresponding indication of the detected ESD event. At 210, the corresponding logic output can be generated (e.g., by output logic 28) to log the detected ESD event. The logic output can provide an interrupt to a processor or other controller to trigger a corresponding function to be performed with respect to the detected ESD event. At 212, the captured event can be stored in memory for subsequent processing and analysis. For example, the logic output can be provided to associated circuitry or system components, which can further process and/or stored the indication of the detected ESD event in memory.

The circuits and methods disclosed herein provide an effective means for detecting an IEC ESD strike and raising an interrupt to the processor of the electronic device. As a result of implementing a system or method according to this disclosure, information about ESD events can be utilized for a variety of purposes. As an example, manufacturers could benefit from logging ESD strikes to either limit return liability or gather real world ESD data.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An electrostatic discharge (ESD) logging system comprising:
    (a) protection circuitry having a differential input including a positive input terminal, a negative input terminal and having clamping circuitry connected to the input terminals;

(b) ESD detection circuitry including:
  (i) positive strike detection circuitry having an input coupled to the clamping circuitry and having a positive detector signal output;
  (ii) first negative strike detection circuitry having an input coupled to the positive input terminal and having a first negative detector signal output; and
  (iii) second negative strike detection circuitry having an input coupled to the negative input terminal and having a second negative detector signal output;
(c) capture circuitry including:
  (i) positive capture circuitry having a positive detector signal input coupled to the positive detector signal output, a positive delayed detector signal output, and a delay stage and a pulse circuit coupled between the positive detector signal input and the positive delayed detector signal output;
  (ii) first negative capture circuitry having a first negative detector signal input coupled to the first negative detector signal output, a first negative delayed detector signal output, and a delay stage and a pulse circuit coupled between the first negative detector signal input and the first negative delayed detector signal output;
  (ii) second negative capture circuitry having a second negative detector signal input coupled to the second negative detector signal output, a second negative delayed detector signal output, and a delay stage and a pulse circuit coupled between the second negative detector signal input and the second negative delayed detector signal output; and
(d) logic circuitry having inputs coupled to the positive delayed detector signal output, the first negative delayed detector signal output, and the second negative delayed detector signal output, and having a strike event output.

2. The logging system of claim 1 in which the positive input terminal and the negative input terminal are connected to corresponding arrangements of diodes to control current flow at the respective input terminals.

3. The logging system of claim 1 in which the positive input terminal and the negative input terminal are connected to corresponding arrangements of diodes connected between a ground terminal and a clamping bus and a switch device is electrically connected between the clamping bus and the ground terminal in parallel with the diodes.

4. The logging system of claim 1 in which each delay stage includes a resistive-capacitive (RC) network.

5. The logging system of claim 1 in which each the capture circuitry includes one of a latch or a Schmitt trigger.

6. The logging system of claim 1 including an integrated circuit carrying the ESD detection circuitry and capture circuitry.

7. The logging system of claim 1 including a processor connected to the strike event output, and a memory coupled to the processor.

8. A process of logging electrostatic discharge (ESD) events on positive and negative, differential input terminals comprising:
  (a) clamping an ESD event that occurs at one of the differential input terminals;
  (b) producing at least one of a positive detector output signal, a first negative detector output signal, and a second negative detector output signal in response to the ESD event at the differential input terminals;
  (c) delaying the at least one detector signal;
  (d) producing a pulse signal from the delayed at least one detector signal; and
  (e) generating a strike event output signal in response to the pulse signal to log the detected ESD event.

9. The process of claim 8 in which the producing includes:
  (i) detecting a positive strike ESD event on either of the terminals and in response producing the positive detector output signal;
  (ii) detecting a negative strike ESD event on one of the terminals and in response producing the first negative detector output signal; and
  (iii) detecting a negative strike ESD event on the other of the terminals and in response producing the second negative detector output signal.

10. The process of claim 8 including combining pulse signals to provide the strike event output signal.

11. The process of claim 8 in which the producing includes:
  (i) detecting a positive strike ESD event on either of the negative or positive terminals and in response producing the positive detector output signal;
  (ii) detecting a negative strike ESD event on the negative differential input terminal and in response producing the first negative detector output signal; and
  (iii) detecting a negative strike ESD event on the positive differential input terminal and in response producing the second negative detector output signal.

12. The process of claim 8 in which the delaying includes delaying producing the pulse signal for a duration sufficient to allow the ESD event to subside as to reduce noise and interference from adversely affecting generating the strike event output signal.

13. The process of claim 8 including logging the strike event output signal in a memory coupled to a processor.

14. An electrostatic discharge (ESD) logging system comprising:
  (a) protection circuitry having a differential input including a positive input terminal, a negative input terminal and having clamping circuitry connected to the input terminals;
  (b) ESD detection circuitry having a plurality of ESD detectors, each of the plurality of ESD detectors having at least one input electrically connected coupled to an input terminal, and a detector output signal providing a detector signal in response to detecting an ESD event at the input terminal;
  (c) capture circuits electrically connected to the detector output signals of the ESD detectors, each respective capture circuit providing a corresponding capture signal to indicate the occurrence of an ESD event that is detected by a respective one of the plurality of ESD detectors; and
  (d) a logic circuit to provide a logic output in response to a capture signal.

15. The logging system of claim 14 including an integrated circuit carrying the protection circuitry, ESD detection circuitry, capture circuitry, logic circuitry, and including processor circuitry, and memory circuitry.

16. The system of claim 14 in which the ESD detection circuitry includes at least one of:
  a positive strike detector to provide the detector signal to indicate the occurrence of a positive ESD strike at the node; and
  a negative strike detector to provide the detector signal to indicate the occurrence of a negative ESD strike at the node.

17. The system of claim 16 in which the positive strike detector is coupled to one terminal, and in which the negative strike detector is coupled to the other terminal.

18. The system of claim 14 in which the ESD event is a transient ESD event, and in which the capture circuitry includes a delay circuit that extends the detector signal to facilitate capture of the extended detector signal following a time period of the transient ESD event.

19. The system of claim 14 in which the capture circuitry includes one of a latch or a Schmitt trigger to provide the capture signal in response to the delayed detection signal.

* * * * *